(12) United States Patent
Mundt et al.

(10) Patent No.: US 10,111,334 B1
(45) Date of Patent: Oct. 23, 2018

(54) INFORMATION HANDLING SYSTEM INTERPOSER ENABLING SPECIALTY PROCESSOR INTEGRATED CIRCUIT IN STANDARD SOCKETS

(71) Applicant: DELL PRODUCTS, L.P., Round Rock, TX (US)

(72) Inventors: Kevin W. Mundt, Austin, TX (US); Sandor Farkas, Round Rock, TX (US); Bhyrav M. Mutnury, Round Rock, TX (US); Yeshaswy Rajupalepu, Bryan, TX (US)

(73) Assignee: Dell Products, L.P., Round Rock, TX (US)

( * ) Notice: Subject to any disclaimer, the term of this patent is extended or adjusted under 35 U.S.C. 154(b) by 15 days.

(21) Appl. No.: 15/474,945

(22) Filed: Mar. 30, 2017

(51) Int. Cl.
| | |
|---|---|
| H05K 7/12 | (2006.01) |
| H05K 7/10 | (2006.01) |
| H05K 1/18 | (2006.01) |
| H01R 12/70 | (2011.01) |
| H05K 1/11 | (2006.01) |
| H05K 3/40 | (2006.01) |
| H01L 23/498 | (2006.01) |
| H01L 21/48 | (2006.01) |

(52) U.S. Cl.
CPC .......... *H05K 1/181* (2013.01); *H01L 21/486* (2013.01); *H01L 21/4857* (2013.01); *H01L 23/49811* (2013.01); *H01L 23/49816* (2013.01); *H01L 23/49822* (2013.01); *H01L 23/49827* (2013.01); *H01L 23/49833* (2013.01); *H01L 23/49838* (2013.01); *H01R 12/7076* (2013.01); *H05K 1/111* (2013.01); *H05K 3/4007* (2013.01); *H05K 2201/10378* (2013.01); *H05K 2201/10704* (2013.01); *H05K 2201/10734* (2013.01)

(58) Field of Classification Search
USPC .......................... 361/767, 752, 808; 174/557
See application file for complete search history.

(56) References Cited

U.S. PATENT DOCUMENTS

| | | | |
|---|---|---|---|
| 5,835,750 | A | 11/1998 | Pan-Ratzlaff |
| 8,133,061 | B1 | 3/2012 | Ayers et al. |
| 9,076,698 | B2 * | 7/2015 | Tran ................. H01L 23/49833 |
| 9,086,874 | B2 | 7/2015 | Johnson et al. |
| 9,510,476 | B2 | 11/2016 | Shirokaze |
| 2001/0021103 | A1 * | 9/2001 | Takagi ................ B62D 5/0406 361/752 |
| 2015/0134868 | A1 | 5/2015 | Shaeffer et al. |

* cited by examiner

*Primary Examiner* — Andargie M Aychillhum
(74) *Attorney, Agent, or Firm* — Isidore PLLC

(57) ABSTRACT

An information handling system (IHS) has a circuit board assembly with a dual-sided interposer substrate that is inserted between a baseboard and a processor integrated circuit having a second pattern of electrical contacts. The dual interposer substrate formed of a stack of printed circuit boards (PCBs) provides communication channels between a first coupling pad on the baseboard that has a first pattern of electrical contacts and a second coupling pad on top of the dual interposer substrate that provides the second pattern of electrical contacts. The second pattern receives another type of processor integrated circuit than a type supported by the first pattern. Stacked vias formed through the stack of PCBs electrically connect respective electrical contacts of the first and second coupling pads to form a corresponding communication channel. One or more grounded vias mitigate signal integrity (SI) anomalies on the communication channels.

18 Claims, 10 Drawing Sheets

INFORMATION HANDLING SYSTEM INTERPOSER ENABLING SPECIALTY PROCESSOR INTEGRATED CIRCUIT IN STANDARD SOCKETS

BACKGROUND

1. Technical Field

The present disclosure relates in general to a processor integrated circuit in an information handling system (IHS), and more particularly to mounting a specialty processor integrated circuit in an IHS.

2. Description of the Related Art

As the value and use of information continue to increase, individuals and businesses seek additional ways to process and store information. One option available to users is information handling systems (IHSs). An IHS generally processes, compiles, stores, and/or communicates information or data for business, personal, or other purposes, thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Computing performance of the IHS depends primarily on the device's processor integrated circuit (IC). Many computing components and infrastructure subsystems in the IHS support the processor IC. The baseboard of the IHS provide power and communication signals to a standard socket that has a pattern of contacts that correspond to a standard processor IC. Considerable design and fabrication expense is devoted to developing each baseboard to integrate all of these communication and power signals and other supporting components. New processor ICs become available that provide features that a subset of customers would value. If the demand of the new processor IC is not sufficient, an original equipment manufacturer (OEM) of the baseboards and IHS may not have sufficient incentive to create a new baseboard with a corresponding new socket for the processor IC with the nonstandard pattern. At the clock speeds of processor ICs, a matching socket integrated on the baseboard is generally believed to be necessary. Close coupling between the baseboard socket and new processor IC can be required in order to avoid signal integrity (SI) anomalies at the communication rates of a typical processor IC.

BRIEF SUMMARY

In accordance with the teachings of the present disclosure, a circuit board assembly includes a baseboard and a dual-sided interposer substrate. The baseboard has a mounting surface to which a first coupling pad is attached. The first coupling pad provides a first pattern of electrical contacts that correspond to at least a first type of integrated circuit. The dual-sided interposer substrate includes a stack of two or more printed circuit boards (PCBs) having a top surface with a top ground plane and a bottom surface with a bottom ground plane. A second coupling pad is attached to the top surface of the dual-sided interposer substrate. The second coupling pad provides a second pattern of electrical contacts that correspond to at least a second type of integrated circuit. One or more stacked vias are formed through the stack of PCBs. Each stacked via extends between and electrically connects respective electrical contacts of the first and second coupling pads to form a corresponding communication channel. At least one grounded via between the top and bottom ground planes is adjacent to a stacked via that functions as a communication channel. The at least one grounded via mitigates signal integrity (SI) anomalies within a corresponding communication channel provided by the adjacent stacked via.

In accordance with embodiments of the present disclosure, an information handling system (IHS) has a circuit board assembly including a baseboard and a dual-sided interposer substrate. The baseboard has a mounting surface to which a first coupling pad is attached. The first coupling pad provides a first pattern of electrical contacts that correspond to a first type of processor integrated circuit. The dual-sided interposer substrate includes a stack of two or more PCBs having a top surface with a top ground plane and a bottom surface with a bottom ground plane. A second coupling pad is attached to the top surface of the dual-sided interposer substrate. The second coupling pad provides a second pattern of electrical contacts that correspond to at least a second type of integrated circuit. One or more stacked vias are formed through the stack of PCBs. Each stacked via electrically connects between respective electrical contacts of the first and second coupling pads to form a corresponding communication channel. At least one grounded via extends between the top and bottom ground, adjacent to a corresponding stacked via. The at least one grounded via mitigates SI anomalies within a corresponding communication channel. A processor integrated circuit has the second pattern of electrical contacts and is received in the second coupling pad.

According to illustrative embodiments of the present disclosure, a method includes attaching, by an automated manufacturing system, a first coupling pad to a mounting surface of a baseboard. The first coupling pad provides a first pattern of electrical contacts to correspond to at least a first type of integrated circuit. The method includes making a dual-sided interposer substrate by creating via holes through two or more PCBs. The automated manufacturing system stacks the two more PCBs in a stack having a top surface and a bottom surface. The method includes attaching a respective top and bottom ground plane to the top and bottom surfaces. The automated manufacturing system forms one or more stacked vias through the stack of PCBs. Each stacked via extends between and electrically connects respective electrical contacts of the first and second coupling pads to form a corresponding communication channel. The method includes forming at least one grounded via between the top and bottom ground planes adjacent to a corresponding stacked via. The at least one grounded via mitigates SI anomalies within a corresponding communication channel. The method includes attaching a second coupling pad attached to the top surface of the dual-sided interposer substrate. The second coupling pad provides a second pattern of electrical contacts that correspond to at least a second type of integrated circuit.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
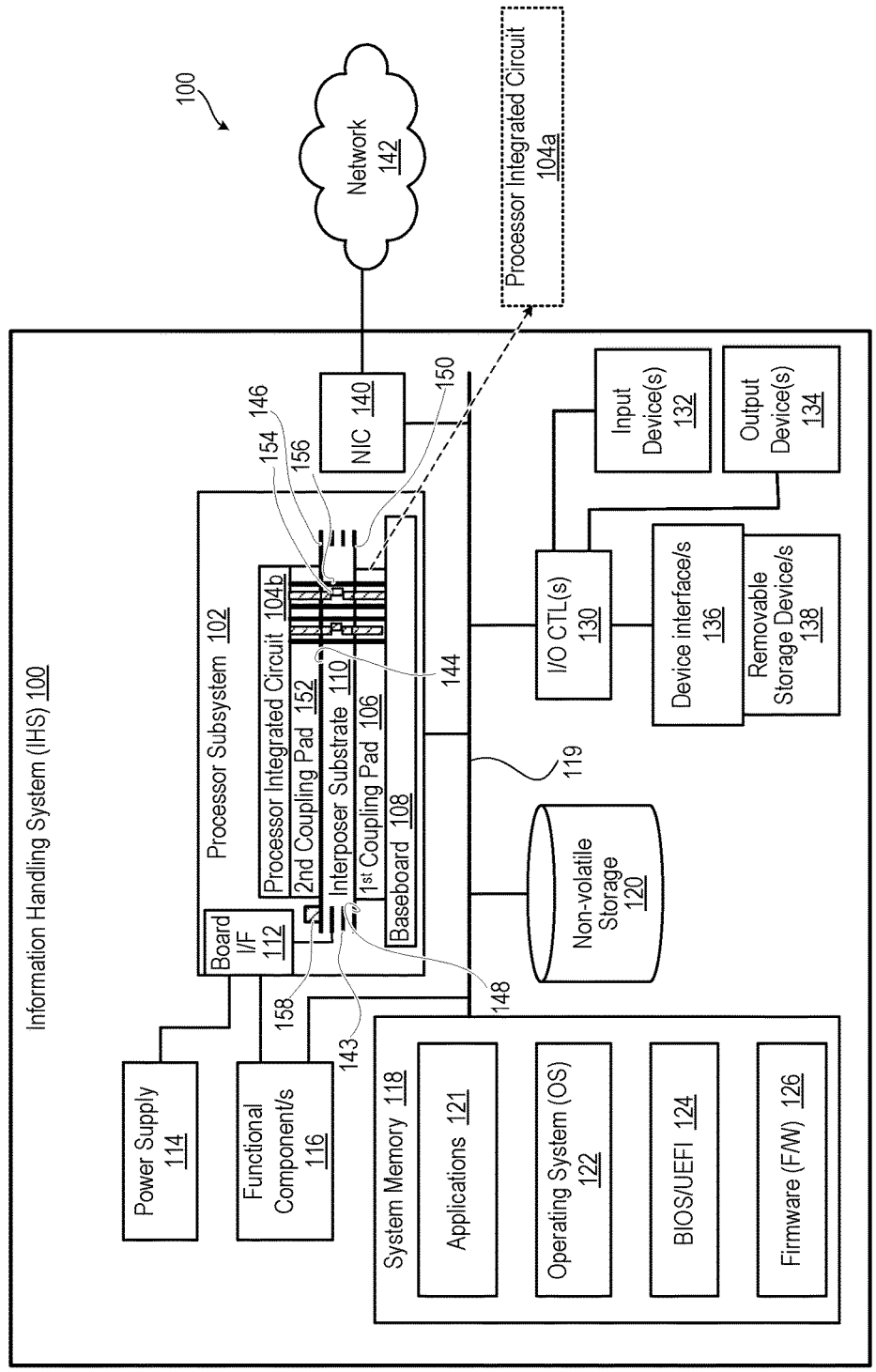
FIG. 1 illustrates a block diagram representation of an example information handling system (IHS) having an interposer substrate that enables use of a processor integrated circuit (IC) designed with contacts that are not supported by a coupling pad of the baseboard, according to one or more embodiments.

An information handling system (IHS) has a circuit board assembly with a dual-sided interposer substrate. The dual-sided interposer substrate is inserted between a baseboard and a processor integrated circuit (IC) having a second pattern of electrical contacts. The dual interposer substrate is formed of a stack of printed circuit boards (PCBs). The dual interposer substrate provides communication channels between a first coupling pad on the baseboard that has a first pattern of electrical contacts and the second coupling pad on top of the dual interposer substrate that provides the second pattern of electrical contacts. Stacked vias, formed through the stack of PCBs, electrically connect respective electrical contacts of the first and second coupling pads to form communication channels. One or more grounded vias are positioned adjacent to each stacked via to mitigate signal integrity (SI) anomalies on the communication channels.

The present innovation provides a scalable solution wherein an interposer substrate serves as an intermediary between a baseboard a processor IC that is not supported by the baseboard. Common central processing unit (CPU) signals and power delivery are passed through the interposer substrate to the processor IC. The signals and power can be directly based from the first coupling pad or from an interface provided by the interposer substrate for sideband connectivity.

In one embodiment, an interposer enables one baseboard design to support more than one type of processor IC such as a class of enterprise CPUs. A "SKYLAKE" class of enterprise CPUs include a base CPU that is sold in high volumes with variant CPUs that require different connection, such as an FPGA version and a fabric version. The FPGA version requires extra requirements than the base CPU including three added rails for 70 W extra power and added sidebands for programming the FPGA version. The fabric version includes a networking solution that requires a networking cable to plug directly to the CPU substrate. Embedding a host fabric interface within the CPU package improves speed, lowers cost and power consumption compared to a standalone fabric interface. These additional features of the FPGA and fabric versions pose additional hardware requirements for a motherboard. Voltage regulators, clocks and sideband breakout connectors are needed. However, in this illustrative example, the market opportunity of the FPGA and fabric versions may not be sufficient to warrant the additional design, manufacturing and support costs required to make specialized motherboards for each version. In addition, generally-known interposer technology used for low data rate integrated circuits is not appropriate for such enterprise CPUs. The present innovation enables an original equipment manufacturer (OEM) to offer an array of enterprise CPUs to serve the varied needs of customers at a price point that is acceptable.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

FIG. 1 illustrates a block diagram representation of an example information handling system (IHS) 100 having computing components such as a processor subsystem 102. The processor subsystem 102 can be selectively provisioned with a first processor integrated circuit (IC) 104a that has a first pattern of contacts that corresponds to a first coupling pad 106 provided on a baseboard 108. With the addition of a dual-sided interposer substrate 110, the same baseboard 108 can be used with a second processor IC 104b that has a second pattern of contacts. The dual-sided interposer substrate 110 can also provide a board interface 112 for power requirements from a power supply 114 that are not supported by the first coupling pad 106. The board interface 112 can also provide for communication with functional component/s 116 that are not supported by the first coupling pad 106.

Within the general context of IHSs, the IHS 100 may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring again to FIG. 1, the processor subsystem 102 is coupled to system memory 118 via system interconnect 119. System interconnect 119 can be interchangeably referred to as a system bus, in one or more embodiments. Also coupled to system interconnect 119 is non-volatile storage (e.g., a non-volatile random access memory (NVRAM)) 120, within which can be stored one or more software and/or firmware modules and one or more sets of data that can be utilized during operations of management IHS 100. These one or more software and/or firmware modules can be loaded into system memory 118 during operation of management IHS 100. Specifically, in one embodiment, system memory 118 can include therein a plurality of such modules, including one or more of application(s) 121, operating system (OS) 122, basic input/output system (BIOS) or Uniform Extensible Firmware Interface (UEFI) 124, and firmware (F/W) 126. These software and/or firmware modules have varying functionality when their corresponding program code is executed by processor subsystem 102 or secondary processing devices within management IHS 100. For example, application(s) 121 may include a word processing application, a presentation application, and a management station application, among other applications.

IHS 100 further includes one or more input/output (I/O) controllers 130 which support connection by and processing of signals from one or more connected input device/s 132, such as a keyboard, mouse, touch screen, or microphone. I/O controllers 130 also support connection to and forwarding of output signals to one or more connected output devices 134, such as a monitor or display device or audio speaker(s). Additionally, in one or more embodiments, one or more device interfaces 136, such as an optical reader, a USB, a card reader, Personal Computer Memory Card International Association (PCMCIA) slot, and/or a high-definition multimedia interface (HDMI), can be associated with IHS 100. Device interface(s) 136 can be utilized to enable data to be read from or stored to corresponding removable storage device/s 138, such as a compact disk (CD), digital video disk (DVD), flash drive, or flash memory card. In one or more embodiments, device interface(s) 136 can further include general purpose I/O interfaces such as inter-integrated circuit ($I^2C$), system management bus (SMB), and peripheral component interconnect (PCI) buses.

IHS 100 comprises a network interface controller (NIC) 140. NIC 140 enables IHS 100 and/or components within IHS 100 to communicate and/or interface with other devices, services, and components that are located external to IHS 100. These devices, services, and components can interface with IHS 100 via an external network, such as example network 142, using one or more communication protocols that include transport control protocol (TCP/IP) and network block device (NBD) protocol. Network 142 can be a local area network, wide area network, personal area network, and the like, and the connection to and/or between network and IHS 100 can be wired, wireless, or a combination thereof. For purposes of discussion, network 142 is indicated as a single collective component for simplicity. However, it should be appreciated that network 142 can comprise one or more direct connections to other devices as well as a more complex set of interconnections as can exist within a wide area network, such as the Internet.

Second processor IC 104b can be a central processing unit (CPU) that has communication channels that operate at sufficiently high clock rates as to be susceptible to signal integrity (SI) anomalies. According to aspects of the present disclosure, the dual-sided interposer substrate 110 mitigates such SI anomalies. In particular, the dual-sided interposer substrate 110 is a stack of two or more PCBs 143 having a top surface 144 with a top ground plane 146 and a bottom surface 148 with a bottom ground plane 150. A second coupling pad 152 is attached to the top surface 144 of the dual-sided interposer substrate 110. The second coupling pad provides a second pattern of electrical contacts that correspond to at least a second type of processor IC (i.e., second processor IC 104b). One or more stacked vias 154 are formed through the stack of PCBs 143. Each stacked via 154 extends between and electrically connects respective electrical contacts of the first and second coupling pads 106, 152 to form a corresponding communication channel. At least one grounded via 156 extends between the top and bottom ground planes 146, 150, adjacent to a corresponding stacked via 154. The at least one grounded via 156 mitigates SI anomalies within a corresponding communication channel provided by the adjacent stacked via 154. The grounded via directs transmitted noise from the adjacent stacked via 154 into ground, thereby preventing the transmitted noise from being received on another stacked via 156 that is carrying a communication channel. The interposer substrate 110 can also incorporate additional functional components 158 such as voltage regulators and oscillators to provide support for second processor IC 104b.

Figure 2:
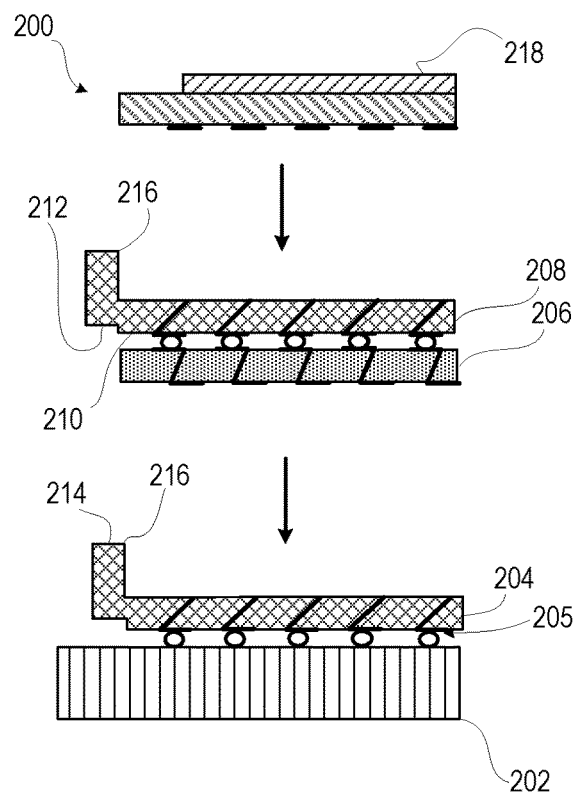
FIG. 2 illustrates a diagram of a disassembled circuit assembly having nesting first and second central processing unit (CPU) sockets that support a thin interposer substrate, according to one or more embodiments.
Figure 3:
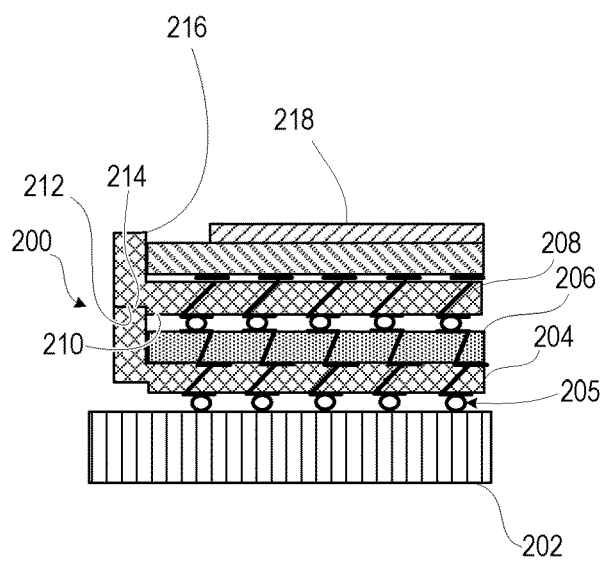
FIG. 3 illustrates a diagram of an assembled circuit assembly having nesting first and second CPU sockets that support a thin interposer substrate, according to one or more embodiments.

In one or more embodiments, FIGS. 2-3 illustrate a circuit board assembly 200 having a baseboard 202. A first coupling pad, such as first CPU socket 204, is attached at electrical contacts 205 to baseboard 202. Thin interposer substrate 206 has reduced height over generally-known interposers that are used for other types of ICs than processor ICs. At the modern clock speeds of processor ICs such as enterprise CPUs, the reduced height can mitigate conductor paths through the interposer substrate from acting as antennas. In FIG. 2, the thin interposer substrate 206 of the circuit board assembly 200 is disassembled from the baseboard 202. In FIG. 3, the circuit board assembly 200 is assembled. The shortened distance of the communication channels through thin interposer substrate 206 improves signal integrity at the high clock speeds of memory communication signals. A second coupling pad, such as second CPU socket 208, has a bottom surface 210 with a peripheral bottom cutout 212 that nests with an upper peripheral edge 214 of the first CPU socket 204. Modifications to socket corners 216 of the first and second CPU sockets 204, 208 enables centering and keying features of the second CPU socket 208. The lower corners/bottom cutout allows a thinner interposer substrate (i.e., interposer substrate 206) to be used, which reduces the SI impact for processor IC 218 that is received in the second CPU socket 208. A heatsink can assist in holding the circuit board assembly 200 together.

Figure 4:
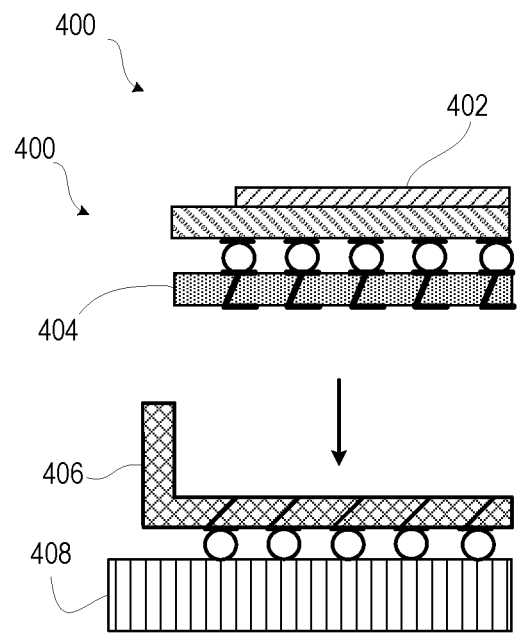
FIG. 4 illustrates a diagram of a disassembled circuit assembly having a thin interposer substrate with balled and soldered processor IC received inside of a CPU socket, according to one or more embodiments.
Figure 5:
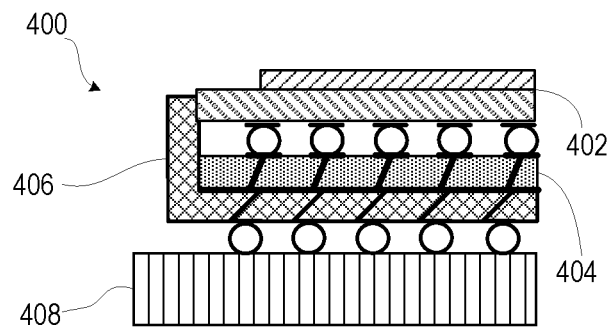
FIG. 5 illustrates a diagram of an assembled circuit assembly having a thin interposer substrate with balled and soldered processor IC received inside of a CPU socket, according to one or more embodiments.

In one or more embodiments, FIGS. 4-5 illustrate a circuit board assembly 400 in which processor IC 402 is balled and soldered directly to an interposer substrate 404. Interposer substrate 404 is also thin for improved SI performance The vertical and lateral dimensions of interposer substrate 404 are sufficiently constrained to fit within a first CPU socket 406 mounted on a baseboard 408. In FIG. 4, the interposer substrate 404 of the circuit board assembly 400 is disassembled from the baseboard 408. In FIG. 5, the circuit board assembly 400 is assembled.

Figure 6:
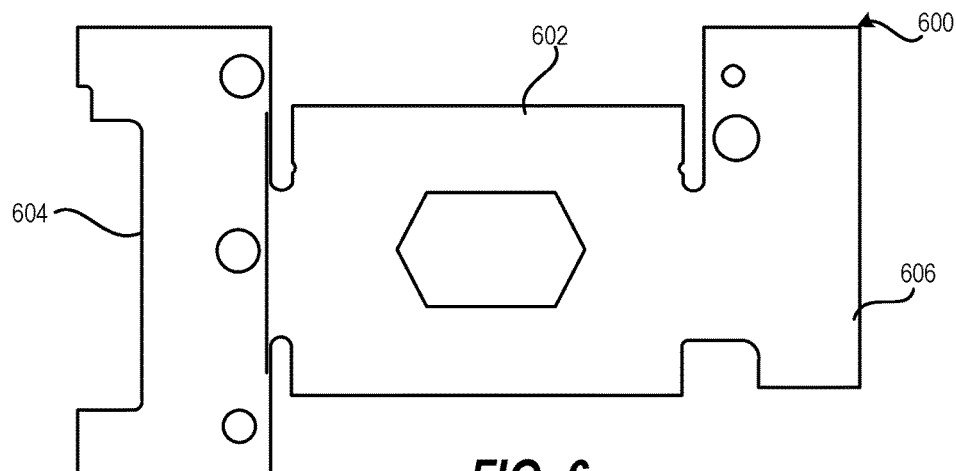
FIG. 6 illustrates a top view of an example interposer substrate, according to one or more embodiments.

FIG. 6 illustrates an exemplary interposer substrate 600 having a central portion 602 and left and right interface portions 604, 606. The central portion 602 is sized for performing the interposer function between two coupling pads or sockets by providing small vertical conductor paths for grounding and communication channels. The interface portions 604, 606 provide additional area extending outside of the coupling pads for integrating functional components such as connectors for coupling to other components of the IHS that are required to communicate with a processor IC.

Figure 7:
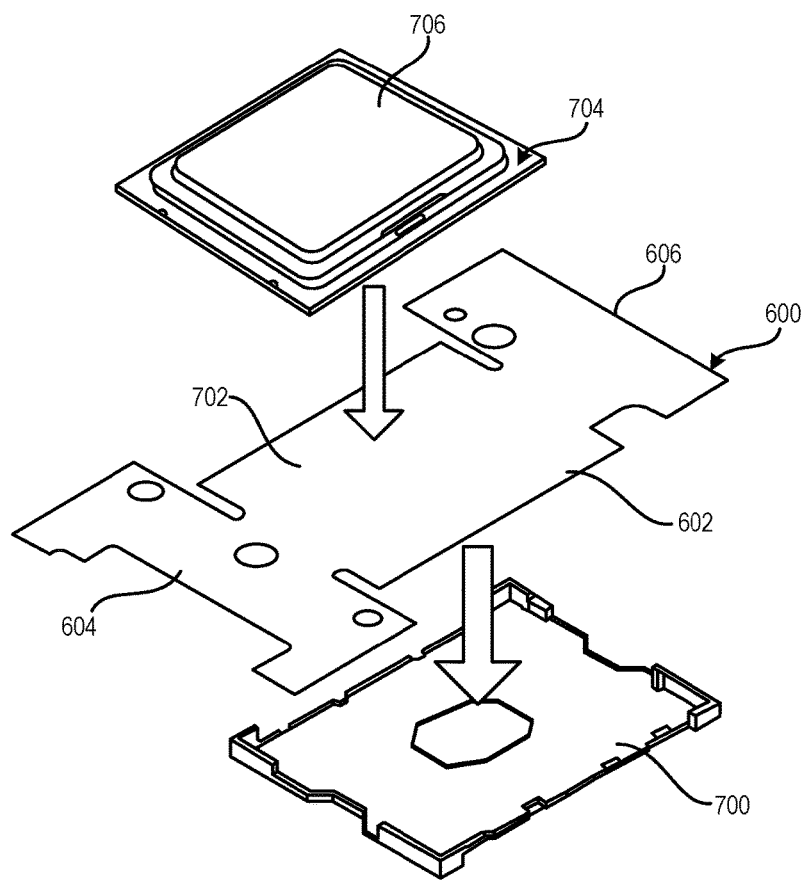
FIG. 7 illustrates an isometric, disassembled view of an example circuit assembly that includes the interposer substrate of FIG. 6, according to one or more embodiments.

FIG. 7 illustrates a first coupling pad 700 having a first connector pattern that receives and engages the central portion 602 of the interposer substrate 600. A top surface 702 of the central portion 602 receives a second coupling pad 704 and processor IC 706. Both second coupling pad 704 and processor IC 706 have a second connector pattern that is different from the first connector pattern.

Figure 8:
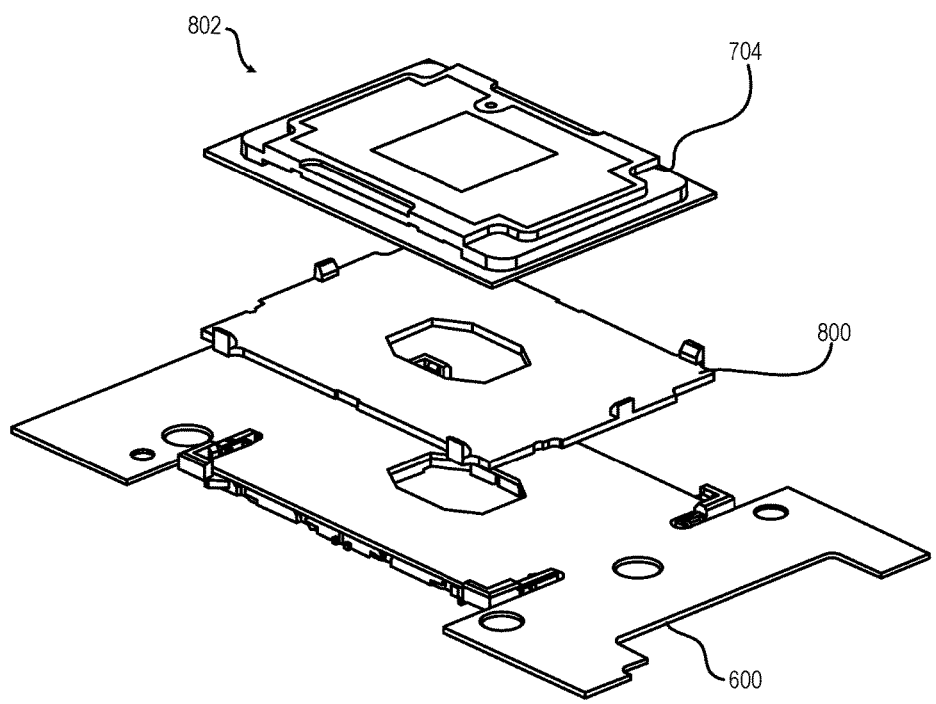
FIG. 8 illustrates an isometric, disassembled view of an example circuit assembly that includes the interposer substrate of FIG. 7 with a C-stack connector, according to one or more embodiments.

FIG. 8 illustrates an Amphenol C-stack connector 800 that is placed between the interposer substrate 600 and the processor IC 706 for centering and keying a resulting assembly 802. C-stack technology is commercially available and can be customized for various stack heights. C-stack technology uses a mechanical force to form an electrical connection rather than requiring soldering, and thus provide simplified servicing. Engaging and disengaging a mechanical connector requires simpler tools than soldering and the engaging and disengaging processes lend themselves to implementation in settings other than an OEM facility.

Figure 9:
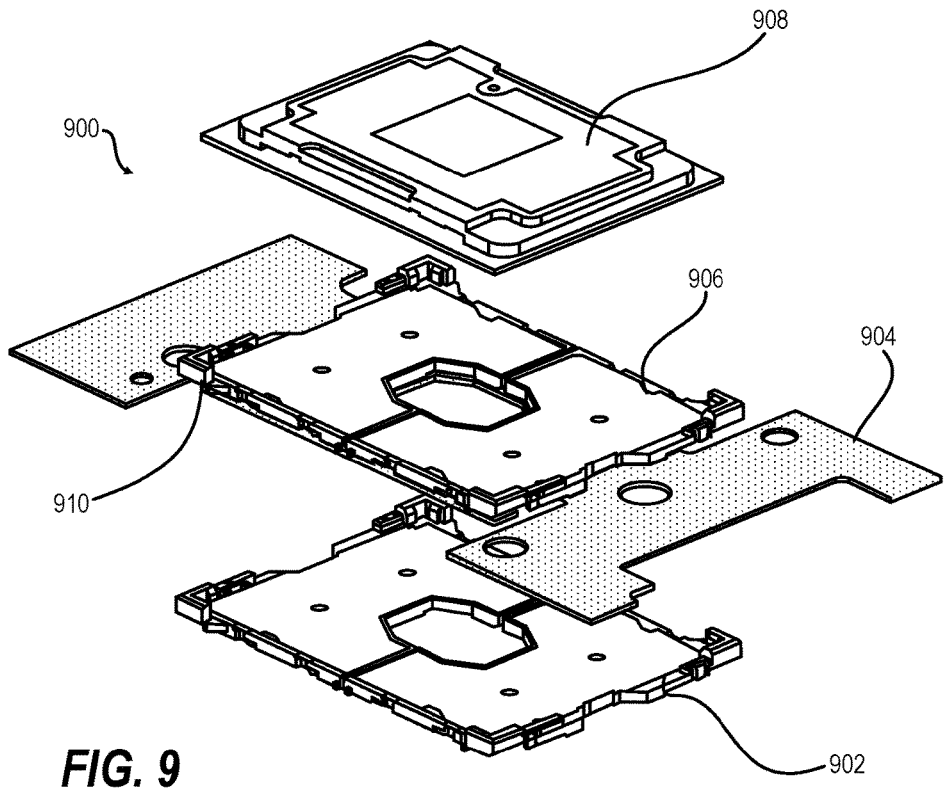
FIG. 9 illustrates an isometric, disassembled view of an example circuit assembly that includes the interposer substrate of FIG. 6 with nesting first and second CPU sockets, according to one or more embodiments.
Figure 10:
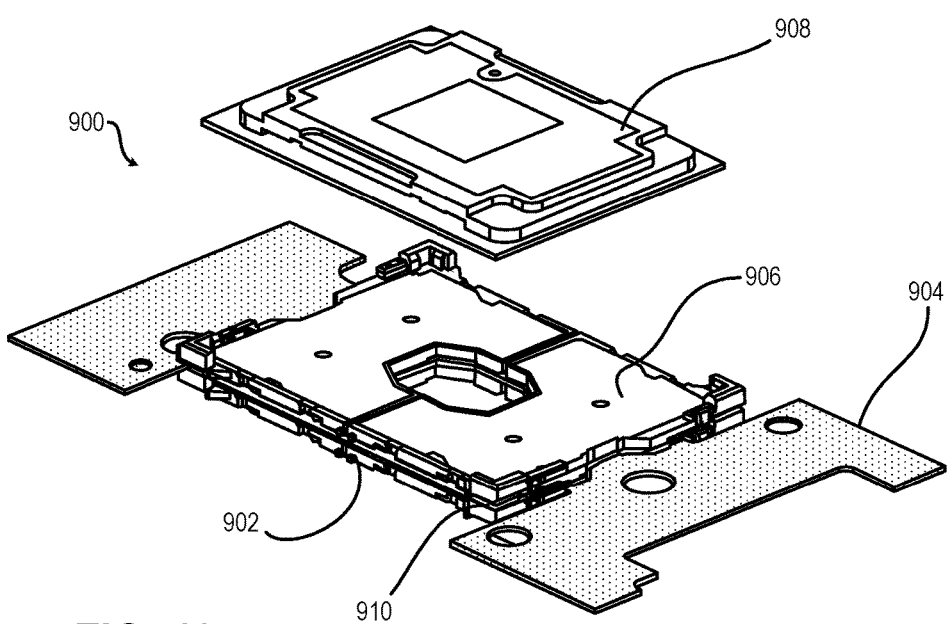
FIG. 10 illustrates an isometric, partially disassembled view of the example circuit assembly of FIG. 9 with nesting first and second CPU sockets, according to one or more embodiments.

FIG. 9 illustrates an example assembly 900 of a first CPU socket 902, an interposer substrate 904, a second CPU socket 906, and a processor IC 908 that are disassembled. FIG. 10 illustrates the first CPU socket 902 nested with the second CPU socket 906 with the interposer substrate 904 sandwiched there-between. The second CPU socket 906 has plastic material removed from a bottom side of the second CPU socket 906 under each of four corners 910 so that the second CPU socket 906 nests to the primary first CPU socket 902 on the motherboard (baseboard 108, FIG. 1). Without the cutouts, the two CPU sockets 902, 906 would have interference and would thus would not properly assemble.

Figure 11:
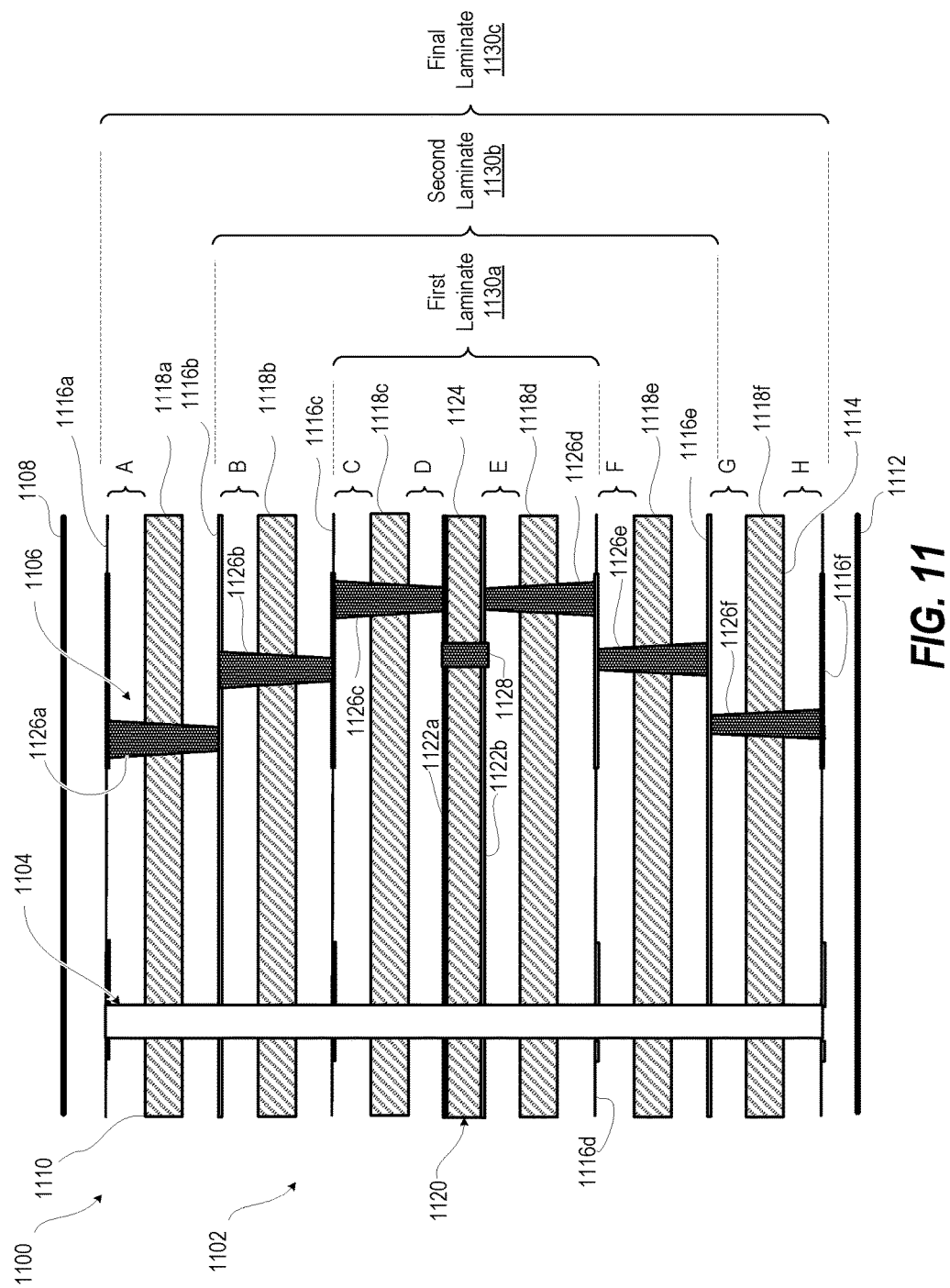
FIG. 11 illustrates a diagrammatic side view of an example interposer substrate having stacked micro-vias, according to one or more embodiments.

FIG. 11 illustrates an example interposer substrate 1100 formed from a stack of thin PCBs 1102 through which is formed at least one grounded via 1104 adjacent to each stacked micro-via 1106 that serves as a communication channel. The interposer substrate 1100 is suitable for communication between a CPU and an associated DRAM memory (not shown) using a very fast bus that is susceptible to SI anomalies. The stack of thin PCBs 1102 can create pass-through signals with the stacked micro-vias 1106 for all memory signals, while maintaining signal requirements, such as acceptable insertion and return losses.

A top ground plane 1108 is attached to a top surface 1110 and a bottom ground plane 1112 is attached to a bottom surface 1114 of the stack of thin PCBs 1102. The grounded via 1104 is electrically connected between both of the top and bottom ground planes 1108, 1112. The stack of thin PCBs 1102 between the top and bottom ground planes 1108, 1112 include a first etched conductive layer 1116a, a first prepreg layer 1118a, a second etched conductive layer 1116b, a second prepreg layer 1118b, a third etched conductive layer 1116c, and a third prepreg layer 1118c. Prepreg refers to "pre-impregnated" composite fibers, where a thermoset polymer matrix material, such as epoxy, is already present. The fibers often take the form of a weave and the matrix is used to bond them together and to other components during manufacture.

The stack of thin PCBs 1102 then includes a core 1120 having top and bottom conductive layers 1122*a*, 1122*b* attached to a buried core substrate 1124. Aligned/layered below the core 1120 is fourth prepreg layer 1118*d*, then fourth etched conductive layer 1116*d*, fifth prepreg layer 1118*e*, fifth etched conductive layer 1116*e*, sixth prepreg layer 1118*f*, and sixth etched conductive layer 1116*f*.

Stacked micro-via 1106 includes micro-vias 1126*a*-1126*f*. Stacked micro-via 1106 also includes a vertical conductor 1128 that passes through core 1120 between top and bottom conductive layers 1122*a*, 1122*b*. The topmost first micro-via 1126*a* projects downward from the first etched conductive layer 1116*a* through the first prepreg layer 1118*a* to contact the second etched conductive layer 1116*b*. The second micro-via 1126*b* projects downward from the second etched conductive layer 1116*b* through the second prepreg layer 1118*b* to contact the third etched conductive layer 1116*c*. The third micro-via 1126*c* projects downward from the third etched conductive layer 1116*c* through the third prepreg layer 1118*c* to contact the top conductive layers 1122*a* of the core 1120. The fourth micro-via 1126*d* attached to the bottom conductive layers 1122*b* of the core 1120 projects down through the fourth prepreg layer 1118*d* to contact the fourth etched conductive layer 1116*d*. The fifth micro-via 1126*e* attached to the fourth prepreg layer 1118*d* projects down through the fifth prepreg layer 1118*e* to contact the fifth etched conductive layer 1116*e*. The sixth micro-via 1126*f* attached to the fifth prepreg layer 1118*e* projects down through the sixth prepreg layer 1118*f* to contact the sixth etched conductive layer 1116*f*. The number of layers is illustrative, and not limiting on the disclosure. Other embodiments of the present innovation can include fewer layers or more layers.

During layup of the stack of thin PCBs 1102, a first laminate 1130*a* is formed from the third etched conductive layer 1116*c*, third prepreg layer 1118*c*, the core 1120, the fourth prepreg layer 1118*d*, and the fourth etched conductive layer 1116*d*. Then, a second laminate 1130*b* is formed in part by adding the second etched conductive layer 1116*b* and the second prepreg layer 1118*b* to the top of the first laminate 1130*a*. The second laminate 1130*b* is completed by adding the fifth prepreg layer 1118*e* and the fifth etched conductive layer 1116*e* to the bottom of the first laminate 1130*a*. Then, a third laminate 1130*c* is formed in part by adding the first etched conductive layer 1116*a* and the first prepreg layer 1118*a* to the top of the second laminate 1130*b*. The third laminate 1130*c* is completed by adding the sixth prepreg layer 1118*f* and the sixth etched conductive layer 1116*f* to the bottom of the second laminate 1130*b*.

In achieving a total thickness of 40 mils for the interposer substrate 1100, the stacked micro-vias 1106 for all passthrough signals are formed using a mid-loss material like high thermal performance epoxy material IS415. Micro-vias provide an advantage of minimizing any crosstalk between stacked micro vias 1106 on both serial links and double data rate (DDR) memory signals. Empirical measurements of a prototype interposer substrate are given in TABLE A. The number of layers are selected to provide: (i) sufficient areas for integrating functional components, (ii) patterns (not shown) provided by the interposer substrate 1100, and (iii) pathways to connectors (not shown) that are peripherally provided on the interposer substrate 1100.

TABLE A

| Gap/Substrate | Start (mils) | Final (mils) |
|---|---|---|
| Gap A | 0.38 | 0.0018 |
| Prepreg 1 | 0.0033 | 0.0033 |
| Gap B | 0.38 | 0.0012 |
| Prepreg 2 | 0.0031 | 0.0031 |
| Gap C | 0.38 | 0.0012 |
| Prepreg 3 | 0.0038 | 0.0038 |
| Gap D | 0.5 | 0.0012 |
| Buried Core | 0.0080 | 0.0080 |
| Gap E | 0.5 | 0.0012 |
| Prepreg 4 | 0.0038 | 0.0038 |
| Gap F | 0.38 | 0.0012 |
| Prepreg 5 | 0.0031 | 0.0031 |
| Gap G | 0.38 | 0.0012 |
| Prepreg 6 | 0.0033 | 0.0033 |
| Gap H | 0.38 | 0.0017 |

Figure 12:
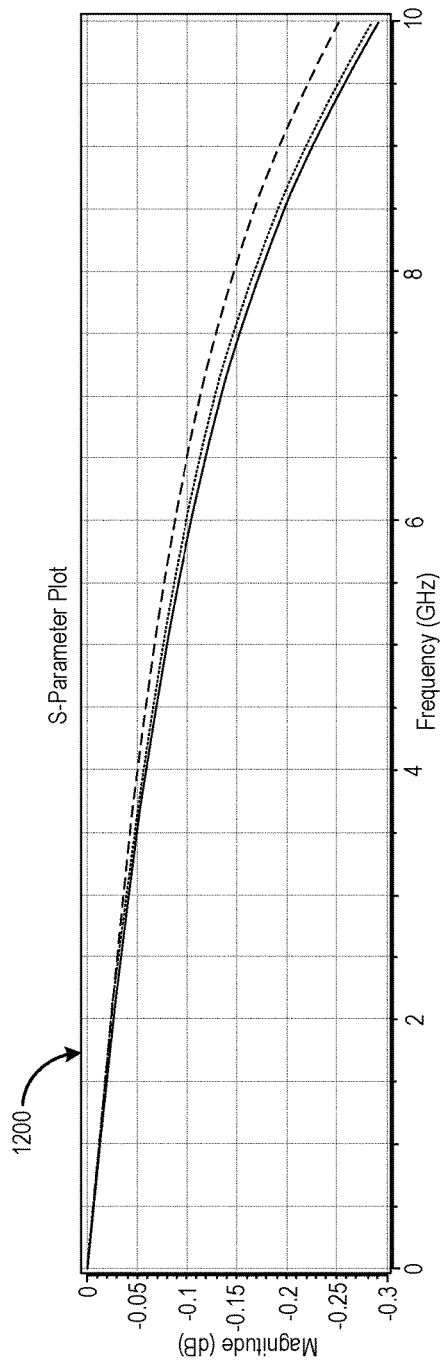
FIG. 12 illustrates a graphical plot of the insertion loss for the example interposer substrate of FIG. 11, according to one or more embodiments.
Figure 13:
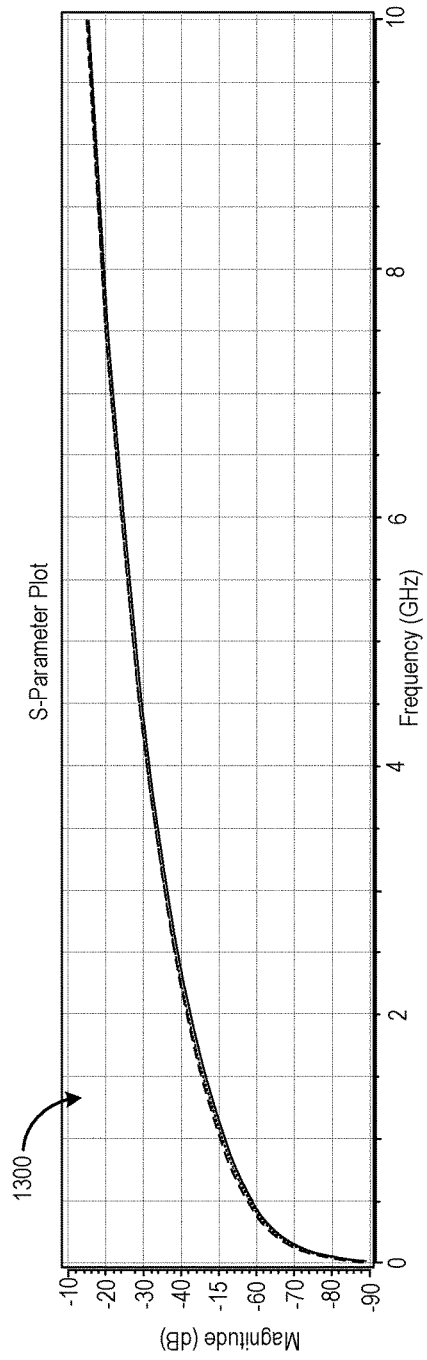
FIG. 13 illustrates a graphical plot of the return loss for the example interposer substrate of FIG. 11, according to one or more embodiments.

The interposer substrate 1100 (FIG. 11) mitigates abnormalities in signal integrity (SI) due to insertion loss and return loss. In a communication system, "insertion loss" is a common term used to describe the signal loss in the system. Return loss is an equally important parameter that measures the reflected signal that bounces back from a terminated device or a discontinuity. Signal attenuation and distortion from dielectric and conductor losses are key factors in proper high-speed communication channel design. PCB insertion loss is a measure of how much the signal is attenuated when going through the PCB. PCB insertion loss increases approximately exponentially with trace length and data transfer frequency. As the data rate increases on traces that become longer, the amount of insertion loss has become a critical performance attribute and is now specified in server platform design guidelines. Return loss can also be a significant cause of performance degradation. In the illustrative plots 1200, 1300, the multiple traces represent a group of 72 communication pins provided by DDR memory. FIG. 12 illustrates a graphical plot 1200 of the insertion loss (thru loss) (<0.02 dB @ NyQuist). FIG. 13 illustrates a graphical plot 1300 of the return loss (reflections) for the proposed stack-up (<45 dB @ NyQuist). Graphical plots 1200 and 1300 illustrate that the insertion loss is <0.02 dB @ 1.5 GHz and return loss is <45 dB @ 1.5 GHz. Based on the plots of FIGS. 12-13, a conclusion can be made that the SI parasitic artifacts are fairly minimal due to this proposed innovation.

Figure 14:
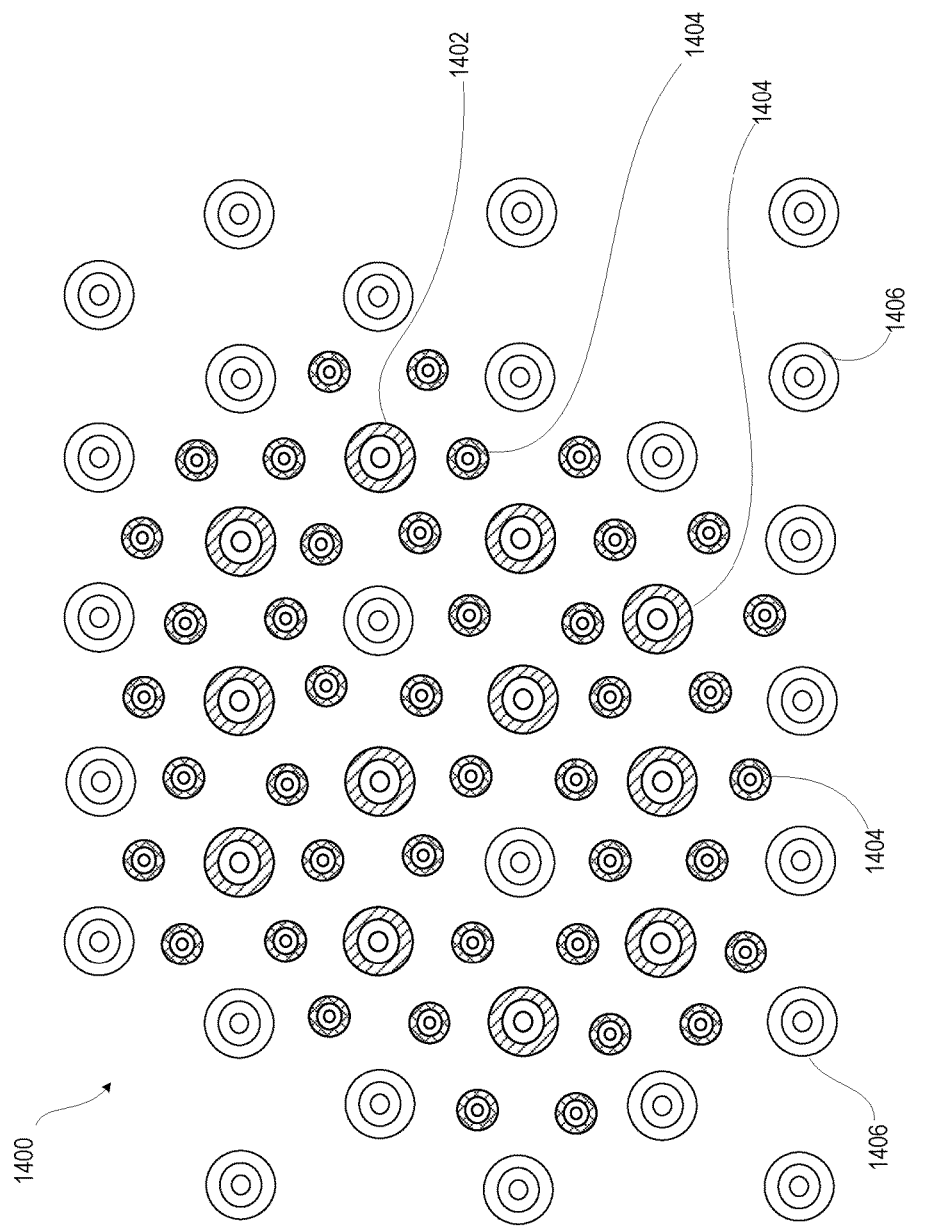
FIG. 14 illustrates an example pattern of grounded vias that mitigate signal integrity (SI) anomalies from impairing performance of stacked micro-vias in an example interposer substrate, according to one or more embodiments.

FIG. 14 illustrates an interposer substrate 1400 having communication channel micro-vias 1402 that are surrounded by more than one grounded via 1404. Also depicted are pin assignments 1406 that do not require mitigation for SI anomalies. Signal integrity simulations resulted in little to no crosstalk and no loss in the signal quality by adding the interposer substrate 1400. The number of grounded vias for signals could be doubled as stacked micro-vias do not impede routing communication channels.

Figure 15:
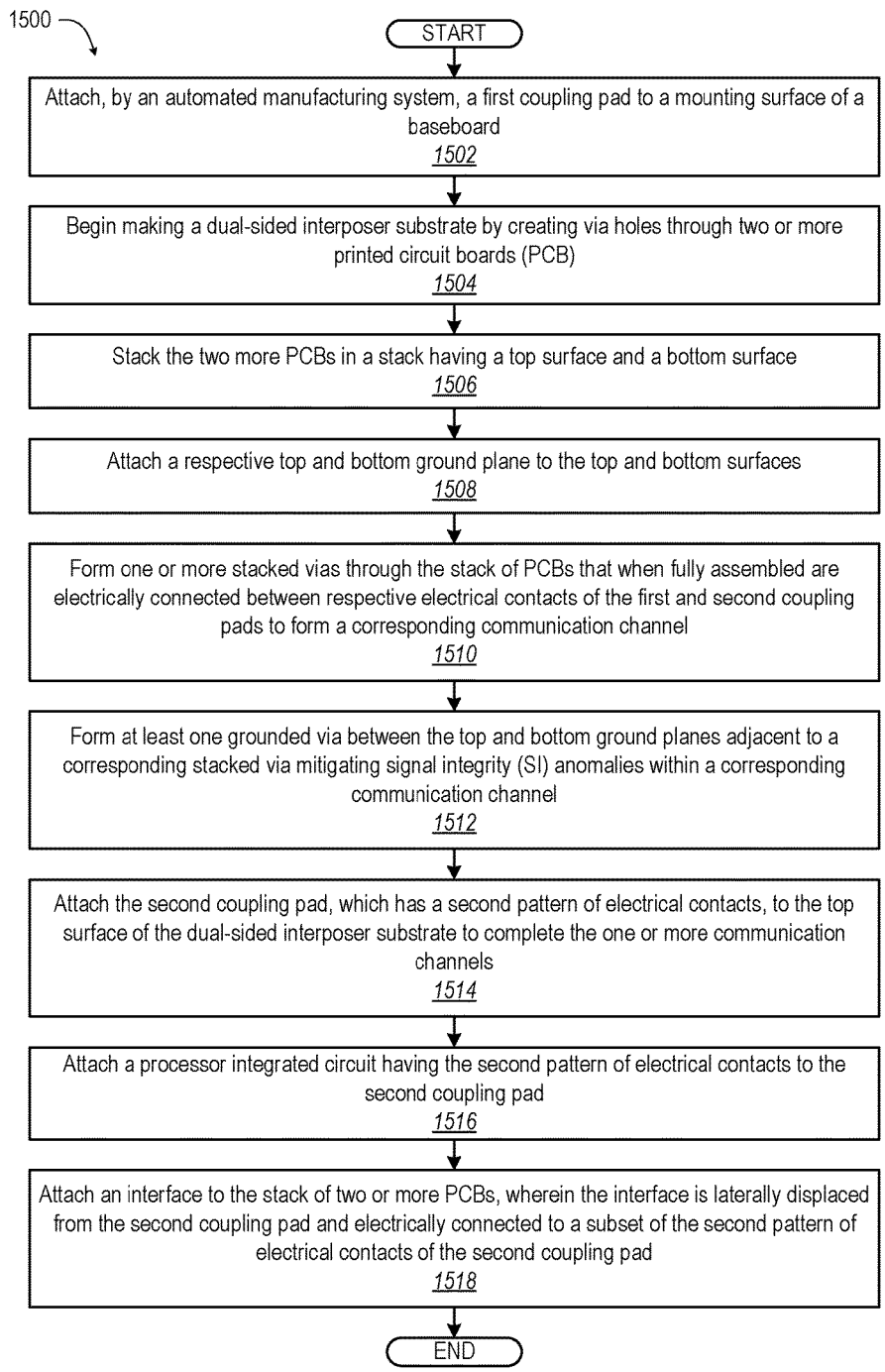
FIG. 15 illustrates a flow diagram of a method of making an IHS having an interposer board, according to one or more embodiments.

FIG. 15 illustrates a method 1500 of making an IHS having an interposer board that enables respective processor integrated circuits having more than one type of pattern of connectors to be mounted to a baseboard. The interposer board mitigates signal integrity (SI) vulnerabilities at high clock speeds of communication channels supported by the interposer. In the illustrative embodiments of the flow chart, method 1500 includes attaching, by an automated manufacturing system, a first coupling pad to a mounting surface of a baseboard (block 1502). The first coupling pad provides a first pattern of electrical contacts to correspond to at least a first type of integrated circuit. The automated manufacturing system begins making a dual-sided interposer substrate by creating via holes through two or more printed circuit boards (PCB) (block 1504). Method 1500 includes the automated manufacturing system stacking the two or more PCBs in a stack having a top surface and a bottom surface (block 1506). The automated manufacturing system attaches a respective top and bottom ground plane to the top and bottom surfaces (block 1508). Method 1500 includes forming, by the automated manufacturing system, one or more stacked vias through the stack of PCBs. When fully assembled, each stacked via extends between and electrically connects respective electrical contacts of the first and second coupling pads to form a corresponding communication channel (block 1510). Method 1500 includes the automated manufacturing system forming at least one grounded via between the top and bottom ground planes adjacent to a corresponding stacked via. The at least one grounded via mitigates SI anomalies within the corresponding communication channel (block 1512). In one or more embodiments, at least two grounded vias are placed adjacent to a corresponding single stacked via that functions as a communication channel. Additional numbers of grounded vias per stacked via, e.g., three or four grounded vias per stacked via, can provide additional mitigation to abnormalities in signal integrity. Higher ratios still can provide some benefit, although reduction in area for communication channels may tend to limit the number to less than five to one. The automated manufacturing system attaches the second coupling pad to the top surface of the dual-sided interposer substrate to complete the one or more communication channels. The second coupling pad provides a second pattern of electrical contacts that correspond to at least a second type of integrated circuit (block 1514). In one or more embodiments, the first and second coupling pads can be a selected one of pin grid array and a ball grid array. The method 1500 includes attaching a processor integrated circuit having the second pattern of electrical contacts to the second coupling pad (block 1516). The automated manufacturing system attaches an interface to the stack of two or more PCBs. The interface is laterally displaced from the second coupling pad and electrically connected to a subset of the second pattern of electrical contacts of the second coupling pad (block 1518). In one embodiment, the interface can support power or communications signals that are not supported by the first coupling pad. Then method 1500 ends.

In the above described flow chart of FIG. 15, one or more of the methods may be embodied in an automated manufacturing controller that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implemented, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A circuit board assembly comprising: a baseboard having a mounting surface to which a first coupling pad is attached, the first coupling pad providing a first pattern of electrical contacts that correspond to at least a first type of integrated circuit; and a dual-sided interposer substrate comprising: a stack of two or more printed circuit boards (PCBs) having a top surface with a top ground plane and a bottom surface with a bottom ground plane; a second coupling pad attached to the top surface of the dual-sided interposer substrate, the second coupling pad providing a second pattern of electrical contacts that correspond to at least a second type of integrated circuit; one or more stacked vias formed through the stack of PCBs, each stacked via electrically connecting between respective electrical contacts of the first and second coupling pads to form a corresponding communication channel; and at least one grounded via extending between the top and bottom ground planes, adjacent to a corresponding stacked via, the at least one grounded via mitigating signal integrity (SI) anomalies, an interface attached to the stack of two or more PCBs, the interface laterally displaced from the second coupling pad and electrically connected to a subset of the second pattern of electrical contacts of the second coupling pad.

2. The circuit board assembly of claim 1, wherein a ratio of grounded vias to a stacked via for a corresponding communication channel is greater than one to one.

3. The circuit board assembly of claim 1, wherein a ratio of grounded vias to a stacked via for a corresponding communication channel is at least three to one.

4. The circuit board assembly of claim 1, wherein the vias are micro vias that mitigate SI anomalies at clocked speeds of a central processing unit (CPU).

5. The circuit board assembly of claim 1, wherein at least one of the first and second coupling pads comprise a selected one of pin grid array and a ball grid array.

6. An information handling system (IHS) comprising:
a circuit board assembly comprising:
   a baseboard having a mounting surface to which a first coupling pad is attached, the first coupling pad providing the first pattern of electrical contacts that correspond to a first type of processor integrated circuit;
   a dual-sided interposer substrate comprising:
      a stack of two or more printed circuit boards (PCBs) having a top surface with a top ground plane and a bottom surface with a bottom ground plane;
      a second coupling pad attached to the top surface of the dual-sided interposer substrate, the second coupling pad providing a second pattern of electrical contacts that correspond to at least a second type of integrated circuit;
      one or more stacked vias formed through the stack of PCBs, each stacked via electrically connecting between respective electrical contacts of the first and second coupling pads to form a corresponding communication channel; and
      at least one grounded via between the top and bottom ground planes adjacent to a corresponding stacked via, the at least one grounded via mitigating signal integrity (SI) anomalies within a corresponding communication channel; and
   a processor integrated circuit having the second pattern of electrical contacts that is received in the second coupling pad.

7. The IHS of claim 6, wherein a ratio of grounded vias to a stacked via for a corresponding communication channel is greater than one to one.

8. The IHS of claim 6, wherein a ratio of grounded vias to a stacked via for a corresponding communication channel is at least three to one.

9. The IHS of claim 6, wherein the vias are micro vias to mitigate SI anomalies at clocked speeds of a central processing unit (CPU).

10. The IHS of claim 6, further comprising an interface attached to the stack of two or more PCBs, the interface laterally displaced from the second coupling pad and electrically connected to a subset of the second pattern of electrical contacts of the second coupling pad.

11. The IHS of claim 6, wherein at least one of the first and second coupling pads comprise a selected one of pin grid array and a ball grid array.

12. A method comprising:
attaching a first coupling pad to a mounting surface of a baseboard, the first coupling pad providing a first pattern of electrical contacts to correspond to at least a first type of integrated circuit;
making a dual-sided interposer substrate comprising:
   creating via holes through two or more printed circuit boards (PCB);
   stacking the two more PCBs in a stack having a top surface and a bottom surface;
   attaching a respective top and bottom ground plane to the top and bottom surfaces;
   forming one or more stacked vias formed through the stack of PCBs, each stacked via electrically connecting between respective electrical contacts of the first and second coupling pads to form a corresponding communication channel;
   forming at least one grounded via between the top and bottom ground planes adjacent to a corresponding stacked via, the at least one grounded via mitigating signal integrity (SI) anomalies within a corresponding communication channel; and
   attaching a second coupling pad attached to the top surface of the dual-sided interposer substrate, the second coupling pad providing a second pattern of electrical contacts that correspond to at least a second type of integrated circuit.

13. The method of claim 12, wherein a ratio of grounded vias to a stacked via for a corresponding communication channel is greater than one to one.

14. The method of claim 12, wherein a ratio of grounded vias to a stacked via for a corresponding communication channel is at least three to one.

15. The method of claim 12, wherein the vias are micro vias to mitigate SI anomalies at clocked speeds of a central processing unit (CPU).

16. The method of claim 12, further comprising attaching an interface to the stack of two or more PCBs, the interface laterally displaced from the second coupling pad and electrically connected to a subset of the second pattern of electrical contacts of the second coupling pad.

17. The method of claim 12, wherein at least one of the first and second coupling pads comprise a selected one of pin grid array and a pin grid array.

18. The method of claim 12, further comprising attaching a processor integrated circuit having the second pattern of electrical contacts to the second coupling pad.

\* \* \* \* \*